(12) United States Patent
Yamamoto et al.

(10) Patent No.: US 10,622,187 B2
(45) Date of Patent: Apr. 14, 2020

(54) CHARGED PARTICLE BEAM APPARATUS AND SAMPLE PROCESSING OBSERVATION METHOD

(71) Applicant: HITACHI HIGH-TECH SCIENCE CORPORATION, Tokyo (JP)

(72) Inventors: Yo Yamamoto, Tokyo (JP); Shota Torikawa, Tokyo (JP); Hidekazu Suzuki, Tokyo (JP); Hiroyuki Suzuki, Tokyo (JP); Mamoru Okabe, Tokyo (JP); Tatsuya Asahata, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/279,628

(22) Filed: Feb. 19, 2019

(65) Prior Publication Data

US 2019/0259574 A1 Aug. 22, 2019

(30) Foreign Application Priority Data

Feb. 20, 2018 (JP) .................................. 2018-028166

(51) Int. Cl.
| | | |
|---|---|---|
| *H01J 37/30* | (2006.01) | |
| *H01J 37/08* | (2006.01) | |
| *H01J 37/28* | (2006.01) | |
| *H01J 37/147* | (2006.01) | |
| *H01J 37/09* | (2006.01) | |
| *H01J 37/14* | (2006.01) | |

(52) U.S. Cl.
CPC .......... *H01J 37/3005* (2013.01); *H01J 37/08* (2013.01); *H01J 37/09* (2013.01); *H01J 37/14* (2013.01); *H01J 37/1472* (2013.01); *H01J 37/28* (2013.01)

(58) Field of Classification Search
CPC ........ H01J 37/3005; H01J 37/08; H01J 37/09; H01J 37/14; H01J 37/1472; H01J 37/28
See application file for complete search history.

(56) References Cited

FOREIGN PATENT DOCUMENTS

| JP | 2007164992 A | 6/2007 |
|---|---|---|
| JP | 2008270073 A | 11/2008 |

*Primary Examiner* — Nicole M Ippolito
*Assistant Examiner* — Hanway Chang
(74) *Attorney, Agent, or Firm* — Holland & Hart LLP

(57) ABSTRACT

Disclosed are a charged particle beam apparatus wherein the charged particle beam apparatus can efficiently performs finish processing of a sample and acquisition of a high-precision SEM image of a processing surface of the sample in a short time, and a sample processing observation method using the same.
The charged particle beam apparatus includes: a gallium ion beam column radiating a gallium ion beam toward a sample to form a cross-section of the sample; an electron beam column having a semi-in-lens type objective lens and radiating an electron beam toward the sample; a gas ion beam column radiating a gas ion beam toward the sample to perform finish processing of the cross-section of the sample, wherein the gas ion beam has a beam diameter larger than a maximum diameter of the cross-section of the sample.

9 Claims, 4 Drawing Sheets

CHARGED PARTICLE BEAM APPARATUS AND SAMPLE PROCESSING OBSERVATION METHOD

CROSS REFERENCE TO RELATED APPLICATION(S)

This application claims the benefit of Japanese Patent Application No. 2018-028166, filed Feb. 20, 2018, which is hereby incorporated by reference in its entirety into this application.

BACKGROUND OF THE INVENTION

1. Technical Field

The present invention relates to a charged particle beam apparatus for performing processing of a sample by using a charged particle beam, and a sample processing observation method using the charged particle beam.

2. Description of the Related Art

In general, for example, as one of methods of analyzing an internal structure of a sample such as a semiconductor device or performing stereoscopic observation, there known a sample cross-section processing and observation method in which a composite charged particle beam apparatus equipped with a focused ion beam (FIB) column and an electron beam (EB) column is used to perform processing of a cross-section of a sample with the FIB and to perform observation of the cross-section with a scanning electron microscope (SEM) (see, for example, Patent Document 1).

As a charged particle beam of such a composite charged particle beam apparatus, a gallium ion beam that uses gallium as an ion source is generally used. However, the gallium ion beam has a high chemical reactivity with the sample, and damage to the surface of the sample is large due to collision of gallium ions, and removal of a damage layer generated thereby is a problem. In order to solve this problem, by additionally providing a gas ion beam column capable of irradiating a sample with a gas ion beam that uses gas such as a rare gas or the like as an ion source to the composite charged particle beam apparatus, a composite charged particle beam apparatus having a triple beam configuration has been developed (for example, see Patent Document 2).

In such a composite charged particle beam apparatus having the triple beam configuration, for example, cross-section processing of the sample is efficiently performed by using the gallium ion beam and then finish processing is performed by removing the damage layer of the cross-section generated by the gallium ion beam by using the gas ion beam. This makes it possible for a cross-section of the sample for observation to be formed with less damage.

Furthermore, with further miniaturization of semiconductor devices, an SEM image of high resolution is required at the time of monitoring processing of the sample. In particular, in a final stage of sample preparation, real time characteristics are required in addition to high resolution characteristics to accurately detect a target position. In order to increase the resolution of the SEM image, a semi-in-lens type in which an electron lens is formed between an electron beam column and the sample has been also used.

DOCUMENTS OF RELATED ART (Patent Document 1) Japanese Patent Application Publication No. 2008-270073.

(Patent Document 2) Japanese Patent Application Publication No. 2007-164992.

SUMMARY OF THE INVENTION

In a case where a semi-in-lens type electron beam column is applied to a composite charged particle beam apparatus as described above, a magnetic field of an objective lens (electron lens) is generated outside the electron beam column. In some cases, a gas ion beam, which is radiated from a gas ion beam column disposed close to the electron beam column, is deflected in an undesired direction due to the magnetic field of the electron lens of the electron beam column. As a result, it has been difficult to perform real-time processing observation in which observation of a SEM image of a processing surface of a sample and finish processing of the sample using the gas ion beam are simultaneously performed.

Furthermore, in the case of alternately performing finish processing of the sample using the gas ion beam and observation of the SEM image of the processing surface of the sample, the magnetic field of the objective lens of the electron beam column is turned off at the time of finish processing of the sample. However, the magnetic field of the objective lens is not completely removed only by turning off an excitation current of the lens due to a hysteresis phenomenon. Due to this, it is required to additionally perform demagnetization. Accordingly, it has been a problem that it takes a long time to switch between irradiation with the gas ion beam and acquisition of the SEM image by the electron beam column.

Accordingly, the present invention has been made keeping in mind the above problems occurring in the related art, and an objective of the present invention is to provide a charged particle beam apparatus having a gallium ion beam column, an electron beam column having a semi-in-lens type objective lens, and a gas ion beam column, wherein the charged particle beam apparatus efficiently performs finish processing of a cross-section of a sample and acquisition of a high-precision SEM image of the cross section of the sample in a short time, and a sample processing observation method using the same.

In order to solve the above objective, according to an aspect of the present invention, there is provided a charged particle beam apparatus and a sample processing observation method as described below.

In other words, the charged particle beam apparatus includes: a gallium ion beam column irradiating a sample with a gallium ion beam to form a cross-section of the sample; an electron beam column having a semi-in-lens type objective lens and irradiating the sample with an electron beam; a gas ion beam column irradiating the sample with a gas ion beam to perform finish processing of the cross-section of the sample, wherein the gas ion beam has a beam diameter larger than a maximum diameter of the cross-section of the sample.

Furthermore, in the present invention, a distance between an intersection point where each of beam optical axes of the gallium ion beam, the electron beam, and the gas ion beam intersects at one point and a front end portion of the gas ion beam column may be longer than a distance between the intersection point and a front end portion of the gallium ion beam column and a distance between the intersection point and a front end portion of the electron beam column.

Furthermore, in the present invention, the gas ion beam column may have an objective lens and a deflection means deflecting the gas ion beam, and the deflection means may be disposed closer to the front end portion of the gas ion beam column than the objective lens.

Furthermore, in the present invention, the deflection means may comprise at least one set of parallel planar electrodes arranged opposite to each other and may deflect the gas ion beam in a direction opposite to a deflection direction in which the gas ion beam is deflected by a magnetic-field leakage from the electron beam column.

Furthermore, in the present invention, the deflection means may have a deflection capability of equal to or greater than 1.5 mm.

Furthermore, in the present invention, a beam energy of the gas ion beam can be from 0.5 keV to 1.0 keV and a beam diameter of the gas ion beam can be from 50 μm to 1000 μm.

Furthermore, in the present invention, the gas ion beam column may have a shielding plate shielding the gas ion beam deflected by an external magnetic field of the electron beam column.

The sample processing observation method according to the present invention is a sample processing observation method using the charged particle beam apparatus described above and includes: a real-time processing observation process of acquiring of SEM images of the cross-section of the sample using the electron beam column in a semi-in-lens mode while simultaneously performing finish processing of the cross-section of the sample using the gas ion beam.

Furthermore, the sample processing observation method according to the present invention is a sample processing observation method using the charged particle beam apparatus described above and includes: alternately performing a finish processing process of performing finish processing of the cross-section of the sample using the gas ion beam and a SEM acquisition process of acquiring a SEM image of the cross-section of the sample using the electron beam in a semi-in-lens mode.

According to the present invention, it is possible to provide the charged particle beam apparatus having the gallium ion beam column, the electron beam column having the semi-in-lens type objective lens, and the gas ion beam column, wherein the charged particle beam apparatus can efficiently perform finish processing of the cross-section of the sample and acquisition of the high-precision SEM image of the cross-section of the sample in a short time, and the sample processing observation method using the same.

BRIEF DESCRIPTION OF THE DRAWING

The above and other objectives, features and advantages of the present invention will be more clearly understood from the following detailed description taken in conjunction with the accompanying drawings, in which.

DESCRIPTION OF THE PREFERRED EMBODIMENTS

Figure 1:
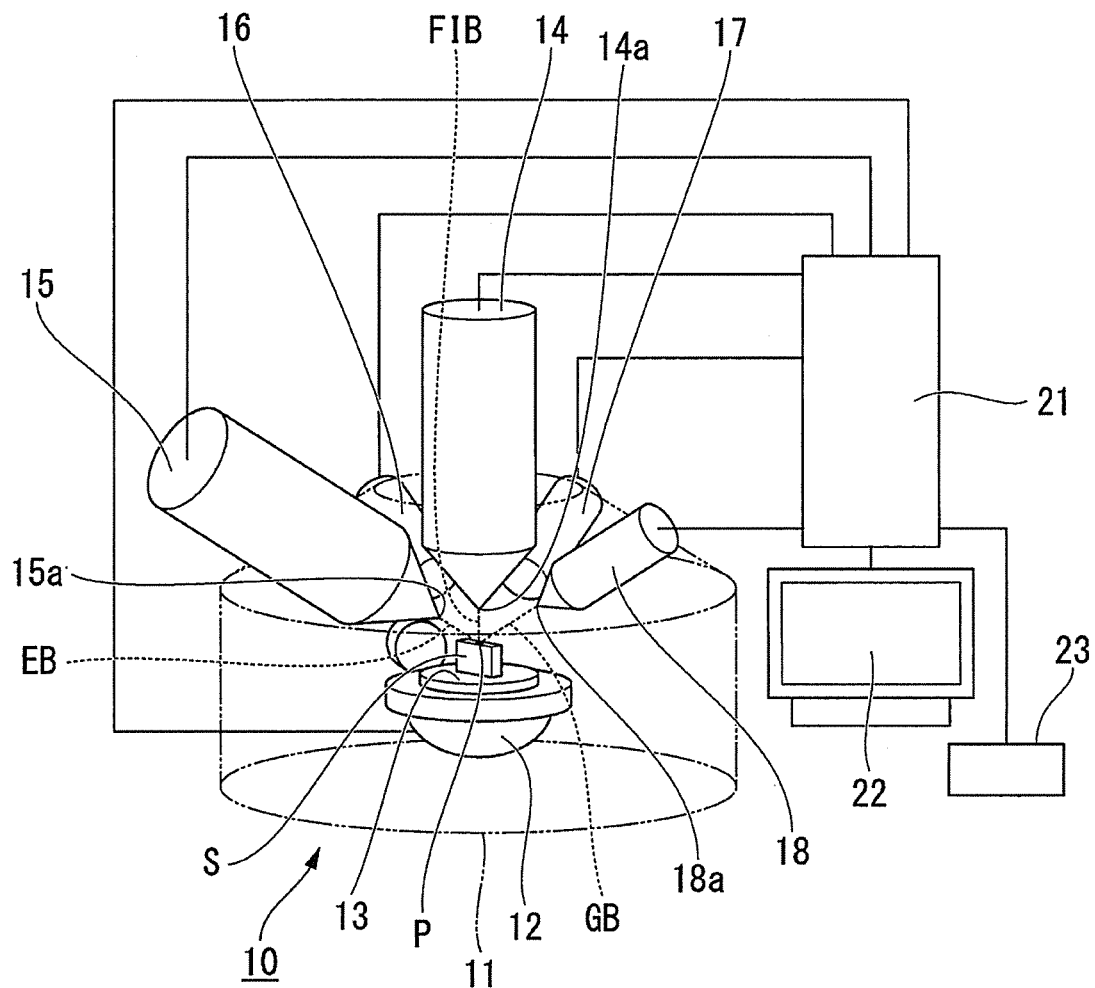
FIG. 1 is a schematic configuration view entirely showing a charged particle beam apparatus according to an embodiment of the present invention.

Hereinafter, a charged particle beam apparatus as an embodiment of the present invention and a sample processing observation method using the same will be described with reference to the accompanying drawings. Embodiments of the present invention are presented to make complete disclosure of the present invention and help those who are ordinarily skilled in the art best understand the invention and the scope of the present invention is not limited to the following embodiments. Also, for convenience of understanding of the elements, the shapes, sizes, etc. of components in the drawings may be exaggerated to make the description clearer, but due to this, the protective scope of the present invention should not be interpreted narrowly.

(Charged Particle Beam Apparatus)

FIG. 1 is a schematic configuration view entirely showing a charged particle beam apparatus according to an embodiment of the present invention.

The charged particle beam apparatus 10 according to the embodiment of the present invention includes a sample chamber 11 capable of maintaining the inside thereof in a vacuum state and a stage 12 provided inside of the sample chamber 11 and securing a sample holder 13 on which a sample s is placed.

The charged particle beam apparatus 10 includes a gallium ion beam column 14 irradiating an object with a gallium ion beam, for example, the sample S in a predetermined irradiation region (i.e., a scanning range) inside of the sample chamber 11. The gallium ion beam column 14 includes a gallium source (not shown) using liquid gallium or the like. For example, a gallium ion beam FIB having a beam diameter of equal to or less than 1 μm is radiated from a front end portion 14a, which is an emitting end of the gallium ion beam column 14. The gallium ion beam has a beam energy of, for example, equal to or greater than 100 eV to equal to or less than 50 keV.

The charged particle beam apparatus 10 includes an electron beam column 15 irradiating the object with an electron beam EB, for example, the sample S in the predetermined irradiation region inside of the sample chamber 11. A more detailed configuration of the electron beam column 15 will be described later.

Furthermore, the charged particle beam apparatus includes a secondary electron detector 16 detecting secondary electrons generated from the sample S due to irradiation of the electron beam. The secondary electron detector 16 detects, when the electron beam irradiates the object such as the sample. S, the intensity of secondary charged particles (secondary electrons) (i.e., the amount of secondary electrons) emitted from the object and outputs information of a detection amount of secondary electrons. The secondary electron detector 16 is disposed inside of the sample chamber 11 at a position detectable the amount of secondary electrons, for example, at an obliquely upward position relative to the object such as the sample S in the irradiation region.

The charged particle beam apparatus 10 includes a gas ion beam column 18 irradiating the object with a gas ion beam, for example, the sample S in the predetermined irradiation region inside of the sample chamber 11. In the present embodiment, an argon ion beam GB using argon, which is a rare gas, is used as the gas ion beam. A more detailed configuration of the gas ion beam column 18 will be described later.

The charged particle beam apparatus 10 includes a gas injector 17 supplying gas to the surface of the object, for example, the sample S. The gas injector 17 has, for example, a nozzle or the like having an outer diameter of about 200 μm. The gas injector 17 supplies, for example, an etching gas for selectively accelerating etching of the sample using the gallium ion beam, a deposition gas for forming a deposition film of a deposit such as a metal, an insulator, or the like on the surface of the sample S, and the like.

The charged particle beam apparatus 10 includes a control device 21, a display device 22, and an input device 23. The control device 21 is control means controlling the gallium ion beam column 14, the electron beam column 15, the secondary electron detector 16, the gas ion beam column 18, the gas injector 17, and the like. The control device 21 is constituted by, for example, a personal computer, an interface, and the like. The display device 22 displays an image of the sample S based on the secondary electrons detected by the secondary electron detector 16.

Furthermore, the charged particle beam apparatus 10 includes a needle mechanism (not shown) and the like moving the sample S placed on the stage 12 in addition to the above-described configuration.

Figure 2:
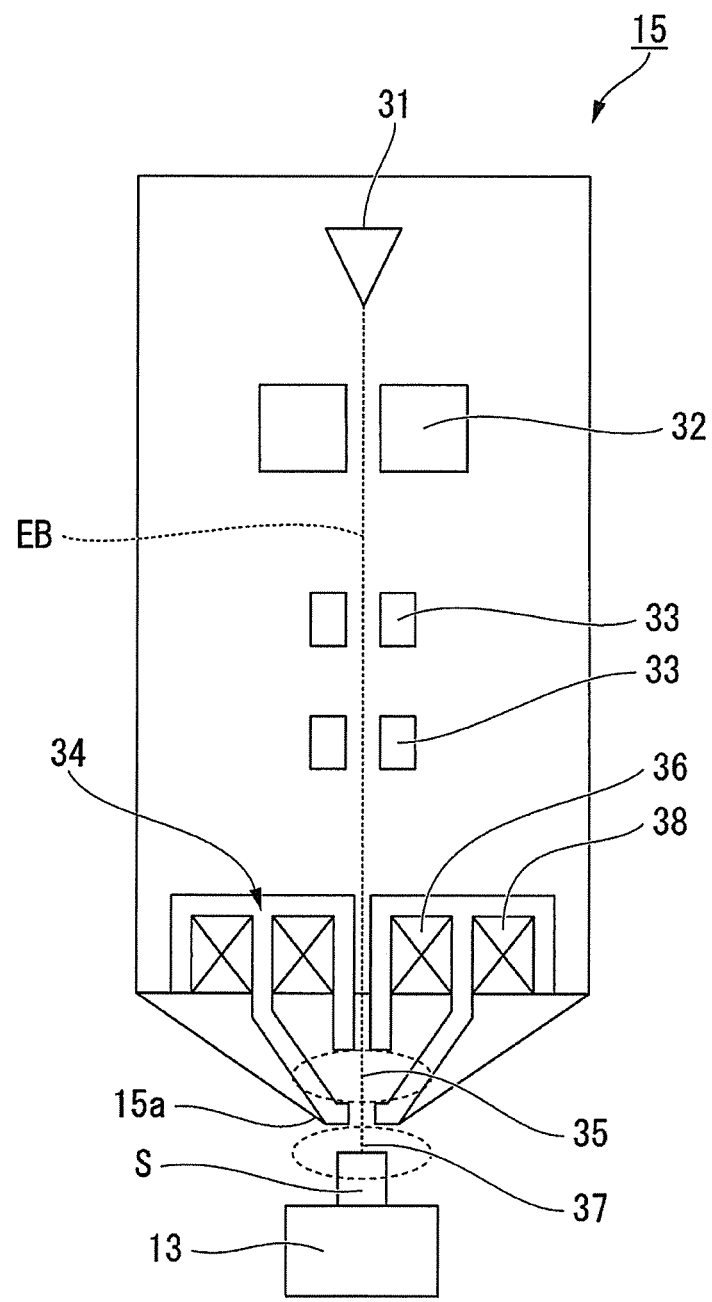
FIG. 2 is a schematic configuration view showing configuration of an electron beam column.

FIG. 2 is a schematic configuration view showing configuration of the electron beam column. In the present embodiment, a semi-in-lens type electron beam column 15 is used as the electron beam column. The electron beam column 15 includes an electron source 31 generating electrons, a condenser lens 32 condensing the electron beam EB emitted from the electron source 31, a deflector 33 deflecting the electron beam EB, an objective lens part 34, and the like.

The objective lens part 34 includes a first coil 36 for forming a first objective lens 35 as an electron lens and a second coil 38 for forming a second objective lens 37 as an electron lens. The first objective lens 35 is formed inside a front end portion 15a which is an emitting end of the electron beam column 15 at a position outside the first coil 36 and the second coil 38. Furthermore, the second objective lens 37 is formed outside the front end portion 15a of the electron beam column 15, for example, at a position between the front end portion 15a of the electron beam column 15 and the sample S placed on the stage 12. A part of the sample S is, for example, within a forming range of the second objective lens 37.

As described above, the electron beam column 15 is a semi-in-lens type in which the first objective lens 35 and the second objective lens 37 are formed between the first coil 36 and the second coil 38, and the sample S. Because the objective lens part 34 of the electron beam column 15 is a semi-in-lens type, the focal length of the electron beam EB is shortened, whereby it is possible to observe the sample S with a higher resolution than, for example, an out-lens type objective lens. Furthermore, because the sample S is disposed outside the first coil 36 and the second coil 38, it is possible to prevent the size of the sample S from being limited by the inner diameters of the first coil 36 and the second coil 38, and to observe the sample S having a larger size than an in-lens type objective lens.

Figure 3:
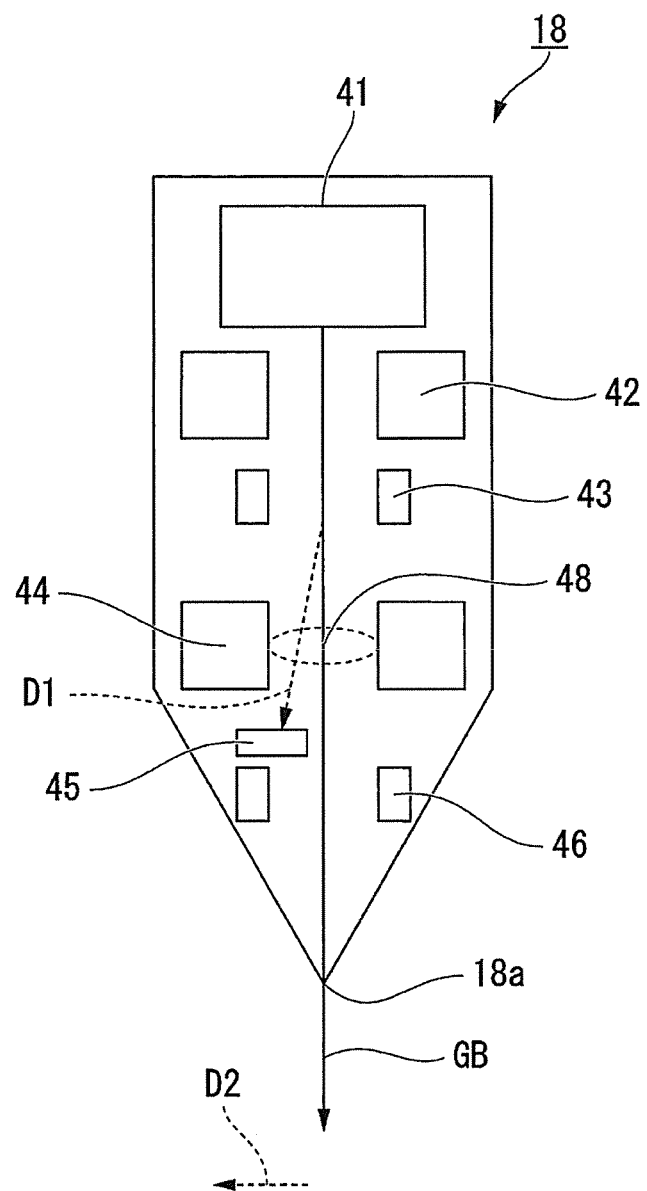
FIG. 3 is a schematic configuration view showing configuration of a gas ion beam column.

FIG. 3 is a schematic configuration view showing configuration of the gas ion beam column. In the present embodiment, the gas ion beam column 18 irradiates the sample S with the argon ion beam. GB using argon as gas. Furthermore, the gas ion beam radiated from the gas ion beam column 18 is not limited to the argon ion beam but may be a gas ion beam using other gases such as neon, krypton, xenon, or the like.

The gas ion beam column 18 includes an argon ion source 41, a condenser lens 42, a blanking electrode 43, an objective lens electrode 44, a shielding plate 45, and a deflection electrode (deflection means) 46 in the order toward to a front end portion 18a which is an emitting end of the gas ion beam column 18.

The gas ion beam column 18 irradiates the sample S with the argon ion beam, which is made by ionizing argon gas, at a low acceleration voltage of about 1.0 keV, for example. Because the argon for beam GB has a lower focusing ability than the gallium ion beam FIB, the etching rate for the sample S is lowered. Thus, the argon ion beam GB is suitable for precise finish processing of a cross-section of the sample S after the cross-section is formed by the gallium ion beam.

The argon ion beam GB radiated from the gas ion beam column 18 has a beam energy of equal to or greater than 0.5 keV to equal to or less than 1.0 key and has a beam diameter of equal to or greater than 50 μm to equal to or less than 1000 μm, more preferably equal to or greater than 100 μm to equal to or less than 300 μm.

The blanking electrode 43 shields the argon ion beam GB by electric conduction.

The objective lens electrode 44 forms inside thereof the objective lens 48 which is an electron lens. The argon ion beam GB is focused by the objective lens 48.

The shielding plate 45 is disposed between the objective lens electrode 44 and the deflection electrode 46 and shields the argon ion beam (see the dotted arrow D1 in FIG. 3) deflected by an external magnetic field so as not to be irradiated by the gas ion beam column 18. The external magnetic field deflecting the argon ion beam is a magnetic field generated in the objective lens part 34 of the electron beam column 15.

Furthermore, it is preferable that either the blanking electrode 43 or the shielding plate 45 selectively provided.

In the electron beam column 15 having the semi-in-lens type objective lens part 34 as in the present embodiment, the second objective lens 37 is formed outside the electron beam column 15 by the second coil 38. Due to this, the gas ion beam column 18 is influenced by the external magnetic field of the electron beam column 15. The shielding plate 45 is disposed at a position on the beam trajectory of the argon ion beam. GB deflected by the external magnetic field. Thus, when the electron beam EB is radiated from the electron beam column 15, the argon ion beam GB is not radiated from the gas ion beam column 18.

The deflection electrode (deflection means) 46 is disposed at a position closer to the front end portion 18a of the gas ion beam column 18 than the objective lens 48. Thus, the objective lens electrode 44 having a larger size (diameter) than the deflection electrode 46 is disposed at a position far from the sample S, and the front end portion. 18a of the gas ion beam column 18 can be narrow in shape. This makes it possible for the front end portion. 18a of the gas ion beam column 18 to be disposed close to the sample S together with the front end portion 14a of the gallium ion beam column 14 and the front end portion 15a of the electron beam column 15.

As shown in FIG. 1, the charged particle beam apparatus 10 of the present embodiment is configured such that from an intersection point P where the beam optical axes of the gallium ion beam FIB, the electron beam. EB, and the argon ion beam GB intersect at one point, a distance to the front end portion 18a of the gas ion beam column 18 is longer than a distance to the front end portion 14a of the gallium ion beam column 14 and a distance to the front end portion 15a of the electron beam column 15.

One of the columns which has a short distance from the front end portion thereof to the sample S can make a narrow beam (beam diameter is small). Thus, the electron beam column 15 requiring high resolution observation and the gallium ion beam column 14 requiring fine processing are disposed closer to the sample S than the gas ion beam column. As a result, the argon ion beam GB is made as a broad beam that is larger in beam diameter than the gallium ion beam FIB. The beam diameter of the argon ion beam GB is not limited, as long as being larger than a maximum diameter of a processing cross-section of the sample S.

Referring again to FIG. 3, the deflection electrode (deflection means) 46 is constituted by at least one set of parallel planar electrodes arranged opposite to each other. The deflection electrode 46 constituted by the parallel planar electrodes deflects the argon ion beam GB in the direction opposite to a deflection direction (see the dotted arrow D2 in FIG. 3) in which the arson ion beam GB is deflected by the magnetic-field leakage from the electron beam column 15.

Thus, by applying to the deflection electrode (deflection means) 46 a voltage generating a magnetic field which has a deflection amount equal to a deflection amount of the argon ion beam GB deflected by the external magnetic field, it is possible to perform field of view correction at the time of processing of the sample S using the argon ion beam GB.

Furthermore, the deflection electrode (deflection means) 46 has a deflection ability of, for example, equal to or greater than 1.5 mm for the argon ion beam GB. Furthermore, by setting the deflection ability of the deflection electrode (deflection means) 46 to be equal to or greater than 1.5 mm, it is possible to restore the deflection (for example, about 1 mm) of the argon ion beam GB due to the external magnetic field generated in the semi-in-lens type objective lens part 34 of the electron beam column 15. This makes it possible to perform finish processing of the sample S by using the argon ion beam GB while observing a processing surface of the sample S by radiating the electron beam EB and to realize real-time monitoring of the processing surface of the sample S at the time of processing.

Furthermore, according to the charged particle beam apparatus 10 of the present embodiment, high-resolution SEM observation using the semi-in-lens type objective lens part 34 and finish processing using the gas ion beam (argon ion beam) are performed, whereby even for a sample having a fine structure, that is, a sample having a small device size, it is possible to detect an end point of finish processing with a high positional accuracy.

Furthermore, the argon ion beam GB has a beam diameter of equal to or greater than 50 μm to equal to or less than 1000 μm, more preferably equal to or greater than 100 μm to equal to or less than 300 μm and has a larger surface processing region than a processing region of the sample, and thus deterioration of the beam shape does not greatly influence processing. Due to this, the gas ion beam column 18 may not be provided with the deflection electrode (deflection means) 46.

Sample Processing Observation Method: First Embodiment

A sample processing observation method according to the present invention using the charged particle beam apparatus 10 having the above-described configuration will be described with reference to FIGS. 1 to 4.

When performing, for example, processing of exposing an observation object (observation surface) inside of the sample S by using the charged particle beam apparatus 10, the sample S before processing is set on the sample holder 13 and then is secured to the stage 12. Then, the stage 12 is moved via the control device 21 to adjust the position of the sample S to an optimum processing position.

Figure 4:
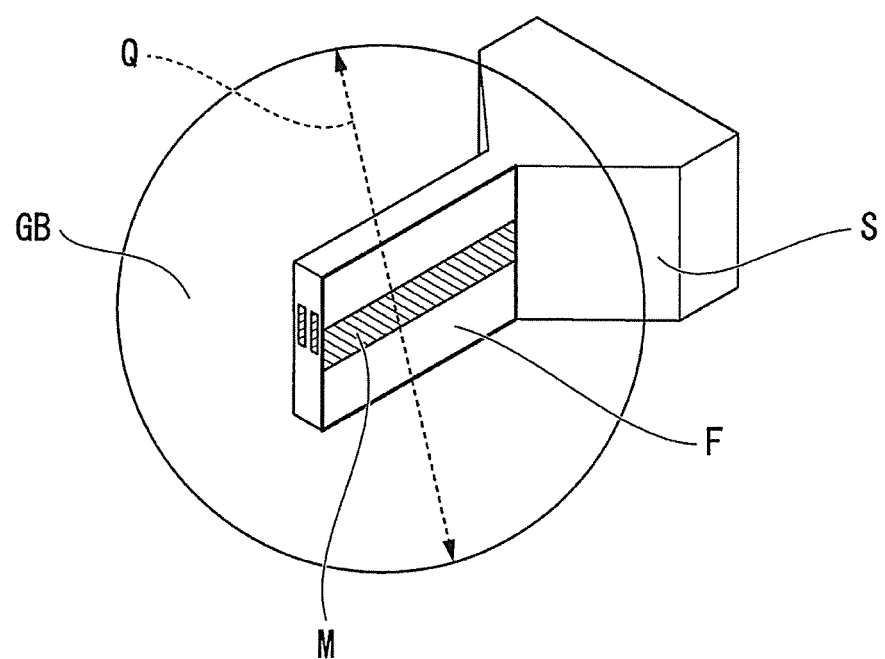
FIG. 4 is an explanatory view showing a state of a sample at the time of finish processing.

Then, first, the gallium ion beam FIB having a beam diameter of, for example, equal to or less than 1 μm is radiated from the gallium ion beam column 14 toward the sample S. Then, as shown in FIG. 4, the sample S is cut by the gallium ion beam FIB to a position (observation surface F) where one surface of a device M formed inside of the sample S is exposed. The size of the observation surface F formed thereby is, for example, about 10 μm×20 μm.

In the gallium ion beam FIB, in order to monitor a processing state of the sample S, the electron beam column 15 irradiates the processing surface of the sample at an arbitrary timing with the electron beam EB, and then the secondary electrons generated at the processing surface are detected by the secondary electron detector 16, and then a SEM image of the processing surface is ascertained on the display device 22. Herein, the electron beam column 15 irradiates the sample S with the electron beam EB in an out-lens mode in which the first objective lens 35 and the second objective lens 37 are formed outside the first coil 36 and the second coil 38, and the first objective lens 35 and the second objective lens 37 are spaced apart from the sample S.

After the sample S is processed to the observation surface F by the gallium ion beam FIB, finish processing is performed in such a manner that a processing mark of the gallium ion beam FIB present on the observation surface F is eliminated to make the observation surface smoother. In the present embodiment, a finish processing process of performing finish processing by irradiating the observation surface F with the argon ion beam GB from the gas ion beam column 18 and a SEM image acquisition process of acquiring the SEM image of the observation surface F by irradiating the observation surface F with the electron beam EB are alternately performed.

As shown in FIG. 4, the argon ion beam GB radiated from the gas ion beam column 18 has a beam diameter Q of equal to or greater than 50 μm to equal to or less than 1000 μm, for example, and is remarkably larger in beam diameter than the gallium ion beam FIB. In other words, the argon ion beam has a beam diameter larger than a maximum diameter of the observation surface F (processing cross-section) of the sample S. As a result, finish processing of the entire observation surface F with a uniform processing amount is possible without scanning by the argon ion beam GB.

In the processing of the sample S having a fine structure such as the device M, a processing amount by the argon ion beam GB may be small, but accurate processing end point detection is required. Because the beam diameter Q of the argon ion beam GB is larger than that of the observation surface F, the argon ion beam having a low energy such as a beam energy of equal to or greater than 0.5 keV to equal to or less than 1.0 keV is used to lower the processing rate, thus making it possible to perform finish processing of the entire observation surface F with the uniform processing amount.

In the present embodiment, the SEM image acquisition process is performed alternately with such a finish processing process. In the SEM image acquisition process, the irradiation of the argon ion beam GB is stopped, and then the electron beam. EB is radiated from the electron beam column 15 in a semi-in-lens mode, and then the secondary electrons generated at the observation surface F are detected by the secondary electron detector 16, thus acquiring a SEM image. By using the electron beam column 15 in the semi-in-lens mode, even if the sample S is disposed at a position spaced apart from the first coil 36 or the second coil 38, it is possible to obtain a high-precision and clear SEM image.

In the present embodiment, the beam diameter of the argon ion beam GB is about 50 μm to 1000 μm. Because the argon ion beam GB has a substantially uniform profile, the positional accuracy at the time of finish processing is about half (25 μm to 500 μm) of the beam diameter. Furthermore, even when an excitation current of the objective lens part 34 of the electron beam column 15 is turned off, and then a lens magnetic field of the first objective lens 35 or the second objective lens 37 is not completely removed due to residual hysteresis, the deflection amount of the argon ion beam GB due to this external magnetic field is about 8 μm and thus does not influence finish processing. This makes it possible to alternately perform the finish processing process and the SEM image acquisition process without requiring demagnetization of the lens magnetic field of the first objective lens 35 or the second objective lens 37.

Sample Processing Observation Method: Second Embodiment

In the second embodiment of the sample processing observation method according to the present invention, at the time of finish processing of the observation surface of the sample S, the finish processing process and the SEM image acquisition process are simultaneously performed. (real-time processing observation process).

In the present embodiment, the argon ion beam GB used for finish processing of the observation surface F of the sample S has a beam diameter of about. 50 μm to 1000 μm, which is larger than the size of the observation surface F of the sample S, and the entire observation surface F is subjected to surface processing without scanning by the argon ion beam GB. Thus, deterioration of the beam shape of the argon ion beam GB does not greatly influence accuracy of finish processing.

Furthermore, because the gas ion beam column 18 has the deflection electrode (deflection means) 46 constituted by the parallel planar electrodes and having a deflection ability of equal to or greater than 1.5 mm, it is possible to restore the deflection (about 1.0 mm) of the argon ion beam deflected by the lens magnetic field of the first objective lens 35 or the second objective lens 37. This makes it possible to realize real-time monitoring at the time of finish processing in which the finish processing process by irradiation the sample S with the argon ion beam GB and the SEM image acquisition process by irradiation the sample S with the electron beam EB are simultaneously performed.

Sample Processing Observation Method: Third Embodiment

In the third embodiment of the sample processing observation method according to the present invention, at the time of finish processing of the observation surface of the sample S, the finish processing process and the SEM image acquisition process are alternately performed.

In the present embodiment, when the SEN image acquisition process is performed, the beam trajectory of the argon ion beam GB is deflected such that the observation surface E of the sample S is not irradiated by the argon ion beam. For example, the deflection electrode (deflection means) 46 of the gas ion beam column 18, which is constituted by the parallel planar electrodes, deflects the argon ion beam GB in the same direction as a deflection direction in which the argon ion beam GB is deflected by the lens magnetic field of the first objective lens 35 or the second objective lens 37 of the electron beam column 15. Thus, a function as a blanker of the argon ion beam GB is exhibited in the SEM image acquisition process.

Furthermore, in the finish processing process using the argon ion beam GB, by applying to the deflection electrode (deflection means) 46 a voltage having a deflection amount equal to the deflection amount of the argon ion beam GB deflected by the external magnetic field of the electron beam column 15, it is possible to perform field of view correction of the argon ion beam GB at the time of finish processing.

Furthermore, as a modification of the third embodiment, in the SEN image acquisition process, the shielding plate 45 provided in the gas ion beam column 18 is used to shield the argon ion beam (see the dotted arrow D1 in FIG. 3) deflected by the external magnetic field of the objective lens part 34 of the electron beam column 15. Thus, even if the blanking electrode 43 is not provided in the gas ion beam column 18, when the electron beam EB is radiated from the electron beam column 15, radiation of the argon ion beam is stopped, thus acquiring a high-precision and clear SEM image.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A charged particle beam apparatus, comprising:
a gallium ion beam column irradiating a sample with a gallium ion beam to form a cross-section of the sample;
an electron beam column having a semi-in-lens-type objective lens and irradiating the sample with an electron beam;
a gas ion beam column irradiating the cross-section of the sample with a gas ion beam to perform finish processing of the cross-section of the sample,
wherein the gas ion beam has a beam diameter larger than a maximum diameter of the cross-section of the sample.

2. The charged particle beam apparatus of claim 1, wherein a distance between an intersection point where each of beam optical axes of the gallium ion beam, the electron beam, and the gas ion beam intersects at one point and a front end portion of the gas ion beam column is longer than a distance between the intersection point and a front end portion of the gallium ion beam column and a distance between the intersection point and a front end portion of the electron beam column.

3. The charged particle beam apparatus of claim 1, wherein the gas ion beam column has an objective lens and a deflection means deflecting the gas ion beam, the deflection means being disposed closer to the front end portion of the gas ion beam column than the objective lens.

4. The charged particle beam apparatus of claim 3, wherein the deflection means comprises at least one set of parallel planar electrodes arranged opposite to each other and deflects the gas ion beam in a direction opposite to a deflection direction in which the gas ion beam is deflected by a magnetic-field leakage from the electron beam column.

5. The charged particle beam apparatus of claim 4, wherein the deflection means has a deflection capability equal to or greater than 1.5 mm.

6. The charged particle beam apparatus of claim 1, wherein a beam energy of the gas ion beam can be from 0.5 keV to 1.0 keV and a beam diameter of the gas ion beam can be from 50 μm to 1000 μm.

7. The charged particle beam apparatus of claim 1, wherein the gas ion beam column has a shielding plate shielding the gas ion beam deflected by an external magnetic field of the electron beam column.

8. A sample processing observation method using the charged particle beam apparatus as claimed in claim 1 comprising:

a real-time processing observation process of acquiring SEM images of the cross-section of the sample using the electron beam column in a semi-in-lens mode while simultaneously performing finish processing of the cross-section of the sample using the gas ion beam.

9. A sample processing observation method using the charged particle beam apparatus as claimed in claim 1 comprising:

alternately performing a finish processing process of performing finish processing of the cross-section of the sample using the gas ion beam and a SEM acquisition process of acquiring SEM images of the cross-section of the sample using the electron beam in a semi-in-lens mode.

\* \* \* \* \*